US007519188B2

(12) United States Patent
Berardi et al.

(10) Patent No.: US 7,519,188 B2
(45) Date of Patent: Apr. 14, 2009

(54) ELECTROACOUSTICAL TRANSDUCING

(75) Inventors: William Berardi, Grafton, MA (US); Hal P. Greenberger, Milford, MA (US); Abhijit Kulkarni, Newton, MA (US)

(73) Assignee: Bose Corporation, Framingham, MA (US)

( * ) Notice: Subject to any disclaimer, the term of this patent is extended or adjusted under 35 U.S.C. 154(b) by 539 days.

(21) Appl. No.: 10/665,845

(22) Filed: Sep. 18, 2003

(65) Prior Publication Data

US 2005/0063555 A1 Mar. 24, 2005

(51) Int. Cl.
*H03G 7/00* (2006.01)

(52) U.S. Cl. .......................................... 381/104; 381/98

(58) Field of Classification Search ................. 381/356, 381/387, 111, 97–109, 56–59, 332, 89, 17–23, 381/300; 181/147, 144, 152
See application file for complete search history.

(56) References Cited

U.S. PATENT DOCUMENTS 4,653,606 A 3/1987 Flanagan et al.
4,739,514 A * 4/1988 Short et al. ................. 381/103
5,870,484 A 2/1999 Greenberger et al.
5,988,314 A 11/1999 Negishi et al.
6,118,883 A * 9/2000 Rocha ........................ 381/387
6,175,489 B1 * 1/2001 Markow et al. ............. 361/683
2004/0196982 A1 * 10/2004 Aylward et al. ............... 381/17

FOREIGN PATENT DOCUMENTS

WO WO 00/52959 9/2000

OTHER PUBLICATIONS

European Official Examination Report issued Dec. 12, 2006, in European Application No. 04104232.6-2002.

* cited by examiner

*Primary Examiner*—Vivian Chin
*Assistant Examiner*—Lun-See Lao
(74) *Attorney, Agent, or Firm*—Fish & Richardson P.C.

(57) ABSTRACT

Audio electrical signals are controlled to be provided to a plurality of electroacoustical transducers of an array to achieve directivity and acoustic volume characteristics that are varied with respect to a parameter associated with operation of the array. The controlling of the signals results in a change in the radiated acoustic power spectrum of the array as the characteristics are varied. The change in the radiated acoustic power spectrum of the array is compensated.

19 Claims, 11 Drawing Sheets

ELECTROACOUSTICAL TRANSDUCING

The present invention relates in general to electroacoustical transducing and more particularly concerns novel apparatus and techniques for selectively altering sound radiation patterns related to sound level.

REFERENCE TO COMPUTER PROGRAM LISTING ON COMPACT DISC

A computer program listing appendix is submitted on a compact disc and the material on compact disc is incorporated by reference. The compact disc is submitted in duplicate and contains the file sharcboot_gemstone.h having 833,522 bytes created Sep. 10, 2003.

BACKGROUND OF THE INVENTION

For background, reference is made to U.S. Pat. Nos. 4,739,514, 5,361,381, RE37,223, 5,809,153, Pub. No. US 2003/0002693 and the commercially available Bose 3•2•1 sound system incorporated by reference herein.

BRIEF SUMMARY OF THE INVENTION

In general, in one aspect, the invention features a method that comprises controlling audio electrical signals to be provided to a plurality of electroacoustical transducers of an array to achieve directivity and acoustic volume characteristics that are varied with respect to a parameter associated with operation of the array, the controlling of the signals resulting in maintaining the radiated relative acoustic power spectrum of the array substantially the same as the characteristics are varied.

Implementations of the invention may include one or more of the following features. The variation is based on a volume level selected by a user. The compensating is based on a signal level detected in the controlled audio electrical signals. The controlling comprises reducing the amplitude of one of the electrical signals for higher acoustic volume levels. The controlling comprises combining two components of an intermediate electrical signal in selectable proportions. The controlling of the audio electrical signals comprises adjusting a level of one of the signals over a limited frequency range. Controlling the audio electrical signals includes processing one of the signals in a high pass filter and processing the other of the signals in a complementary all pass filter.

In general, in another aspect, the invention features an apparatus comprising an input terminal to receive an input audio electrical signal, and circuitry (a) to generate two related output audio electrical signals from the input audio signal for use by a pair of electroacoustical transducers of an array, (b) to control the two output signals to achieve predefined directivity and acoustic volume characteristics that are varied with respect to a parameter associated with operation of the array, and (c) to compensate for a change in the radiated acoustic power spectrum of the array that results from the controlling of the signals.

Implementations of the invention may include one or more of the following feartures. The circuitry comprises a dynamic equalizer. The dynamic equalizer includes a pair of signal processing paths and a mixer to mix signals that are processed on the two paths. The circuitry is also to compensate for the change based on a volume level.

In general, in another aspect, the invention features an electroacoustical transducer array comprising: a pair of electroacoustical transducers driven respectively by related electrical signal components, an input terminal to receive an input audio electrical signal, and circuitry (a) to generate two related output audio electrical signals for use by the pair of electroacoustical transducers of an array, (b) to control the two output signals to achieve predefined directivity and acoustic volume characteristics that are varied with respect to a parameter associated with operation of the array, and (c) to compensate for a change in acoustic power spectrum of the array that results from the controlling of the signals. The circuitry comprises a dynamic equalizer. The dynamic equalizer includes a pair of signal processing paths and a mixer to mix signals that are processed on the two paths. The apparatus comprises a second input terminal to carry a signal indicating a volume level for use by the circuitry.

In general, in another aspect, the invention features a sound system comprising a pair of electroacoustical transducer arrays, each of the arrays comprising: a pair of electroacoustical transducers or drivers driven respectively by related electrical signal components, an input terminal to receive an input audio electrical signal, and circuitry (a) to generate two related output audio electrical signals for use by the pair of electroacoustical transducers of an array, (b) to control the two output signals to achieve predefined directivity and acoustic volume characteristics that are varied with respect to a parameter associated with operation of the array, and (c) to compensate for a change in radiated acoustic power spectrum of the array that results from the controlling of the signals.

In general, in another aspect, the invention features an apparatus comprising a speaker array comprising a pair of adjacent speakers each having an axis along which acoustic energy is radiated from the speaker, and circuitry (a) to generate two related output audio electrical signals from an input audio signal for use by the pair of speakers, and (b) to control the two output signals to achieve predefined directivity and acoustic volume characteristics, the speakers being oriented so that the axes are separated by an angle of about 60 degrees.

It is an important object of the invention to provide electroacoustical transducing with a number of advantages.

Other features, objects and advantages of the invention will become apparent from the following description when read in connection with the accompanying drawing in which:

DETAILED DESCRIPTION

Figure 1:
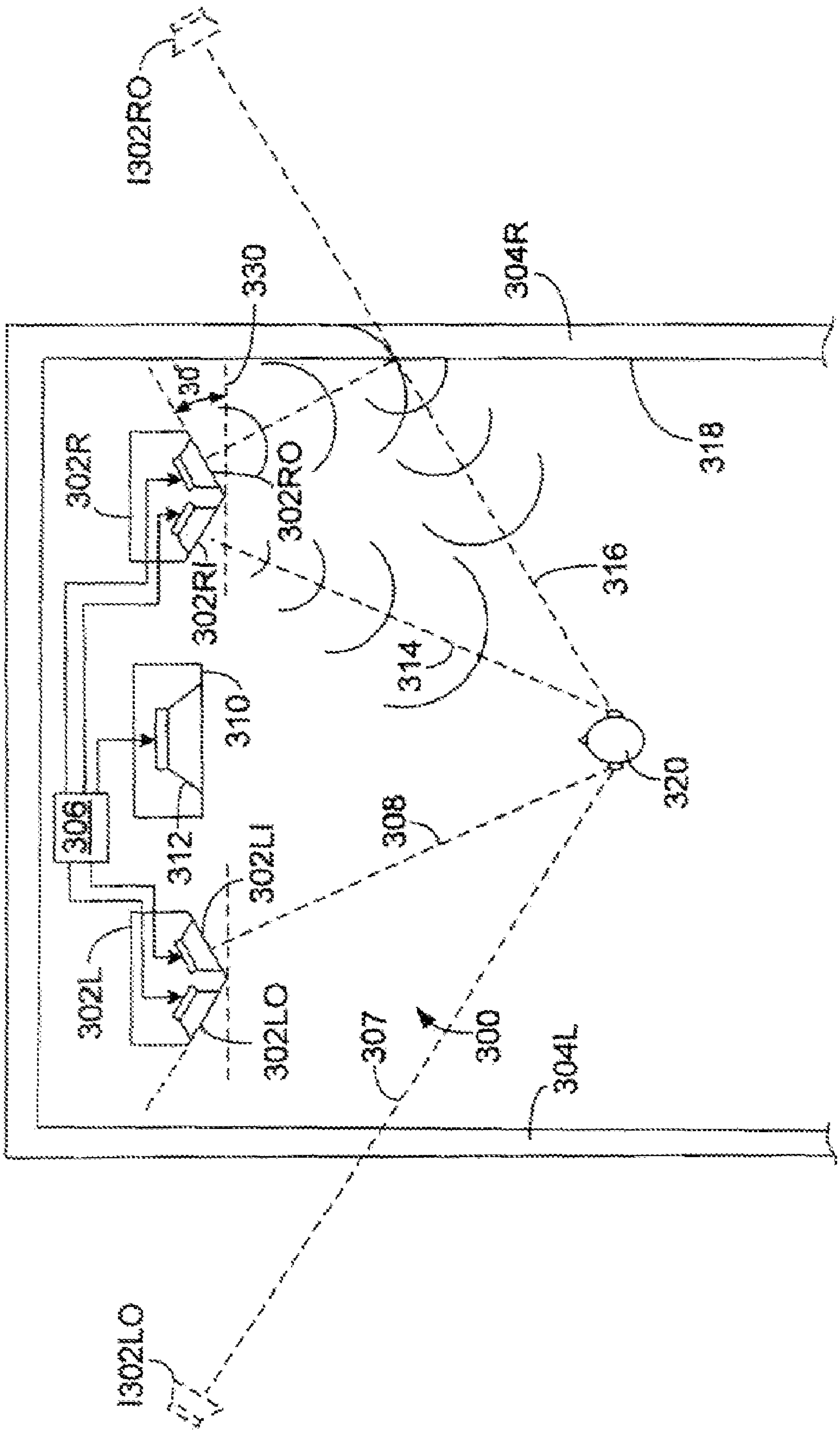
FIG. 1 is a pictorial representation of an electroacoustical system according to the invention seated in a room.

With reference now to the drawing and more particularly FIG. 1, a loudspeaker system 300 according to the invention includes a left loudspeaker enclosure 302L having an inside driver 302LI and an outside driver 302LO and a right loudspeaker enclosure 302R having a right inside driver 302RI and a right outside driver 302RO. The spacing between inside and outside drivers in each enclosure measured between the centers is typically 81 mm. These enclosures are constructed and arranged to radiate spectral components in the mid and high frequency range, typically from about 210 Hz to 16 KHz. Loudspeaker system 300 also includes a bass enclosure 310 having a driver 312 constructed and arranged to radiate spectral components within the bass frequency range, typically between 20 Hz and 210 Hz. A loudspeaker driver module 306 delivers an electrical signal to each driver. There is typically a radiation path 307 from left outside driver 302LO reflected from wall 304L to listener 320 and from right outside driver 302RO over path 316 after reflection from right wall 304R. Apparent acoustic images of left outside driver 302LO and right outside driver 302RO are 1302LO and 1302RO, respectively. For spectral components below a predetermined frequency $F_d$=c/2D, where c=331 m/s, the velocity of sound in air, and D is the spacing between driver centers, typically 0.081 m, where $F_d$ is about 2 KHz, the radiation pattern for each enclosure is directed away from listener 320 with more energy radiated to the outside of each enclosure than to listener 320.

For a range of higher frequencies, typically above 2 KHz, sound from the inside drivers 302LI and 302RI reach listener 320 over a direct path 308 and 314, respectively, and from outside drivers 302LO and 302RO after reflection from walls 304L and 304R, respectively.

Figure 2:
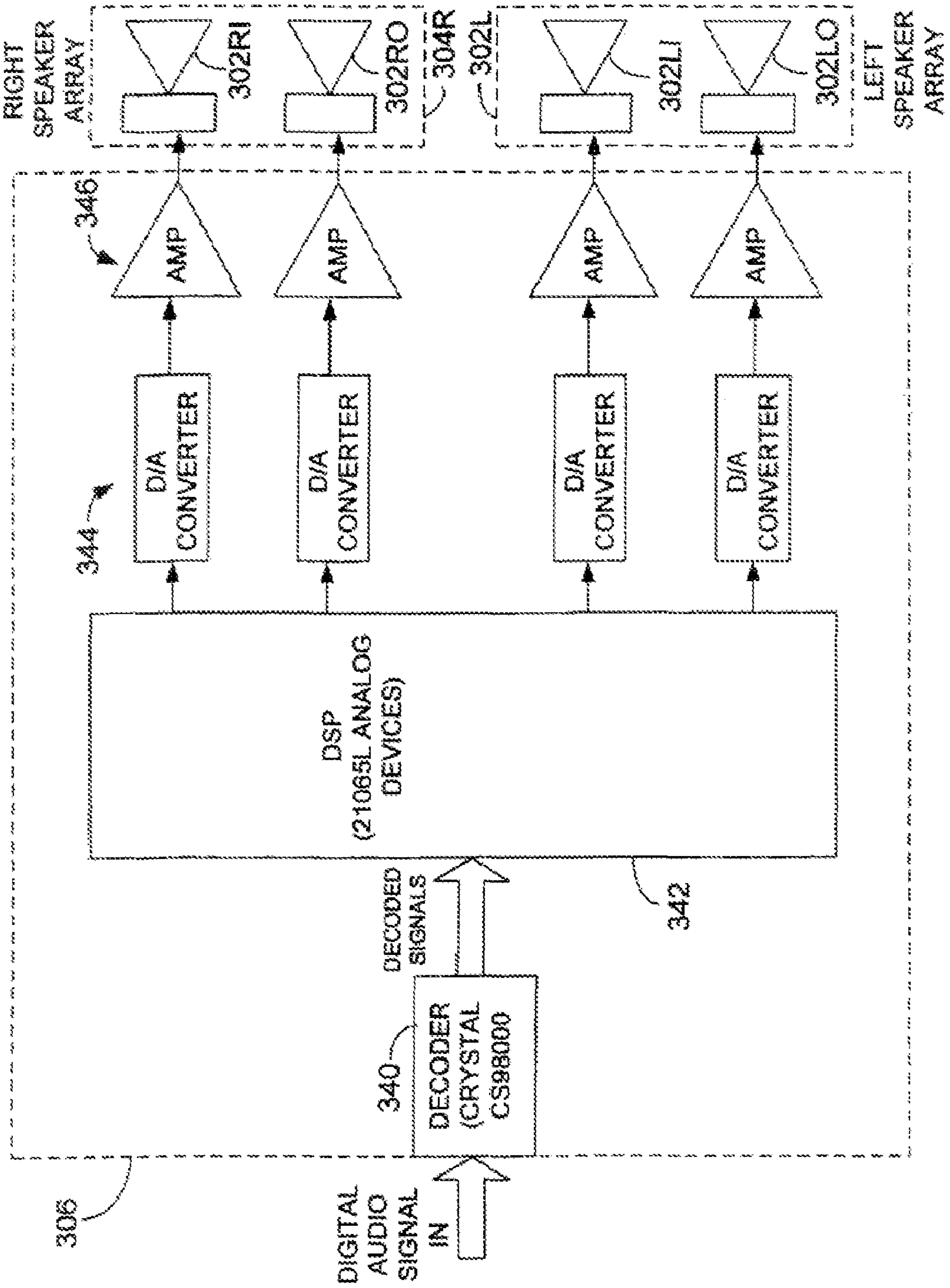
FIG. 2 is a block diagram illustrating the logical arrangement of a system according to the invention.

Referring to FIG. 2, there is shown a block diagram illustrating the logical arrangement of circuitry embodying driver module 306. A digital audio signal N energizes decoder 340, typically a Crystal CS 98000 chip, which accepts digital audio encoded in any one of a variety of audio formats, such as AC3 or DTS, and furnishes decoded signals for individual channels, typically left, right, center, left surround, right surround and low frequency effects (LFE), for a typical 5.1 channel surround system. A DSP chip 342, typically an Analog Device 21065L performs signal processing for generating and controlling audio signals to be provided to the drivers inside the enclosures, including those in the right enclosure 304R, the left enclosure 304L and bass enclosure 310. D/A converters 344 convert the digital signals to analog form for amplification by amplifiers 346 that energize the respective drivers.

The distance between driver centers of 81 mm corresponds to a propagation delay of approximately 240 μs. In the frequency range below $F_d$, the system is constructed and arranged to drive one of the drivers in an enclosure radiating a cancelling signal attenuated 1 dB and inverted in polarity relative to the signal energizing the other driver to provide a 180° relative phase shift at all frequencies below $F_d$. This attenuation reduces the extent of cancellation, allowing more power to be radiated while preserving a sharp notch in the directivity pattern. By changing the delay in the signal path to one of the drivers from 0 μs to 240 μs, the effective directivity pattern changes from that of a dipole for 0 μs delay to a cardioid when the signal delay furnished is 240 μs that corresponds to the propagation delay between centers. For signal delays between these extremes, the notch or notches progressively change direction. In addition to using variable delay to alter the directivity pattern, other signal processing techniques can be used, such as altering the relative phase and magnitude of signals applied to the various drivers.

According to the invention, cancellation may be reduced below the frequency $F_d$ by attenuating the broadband signal applied to one of the drivers, typically the cancelling signal, or over a narrower frequency range by attenuating one of the signals only over that narrower frequency range. Frequency selective modification of cancellation is described in more detail below.

There are a number of ways in which cancellation can be modified. The methods described in more detail here are advantageous in that changes generated in the directivity of the radiated power as a function of frequency resulting from modification of cancellation may be compensated by equalization when the modification is accomplished by attenuating the canceling signal either over the entire frequency range, or a portion of the frequency range. Any processing that modifies the relative magnitude, relative phase, or relative magnitude and phase of signals applied to drivers can be used to modify the cancellation. Relative magnitude can be modified by altering gain. Relative magnitude over a selected frequency range can be accomplished using a frequency selective filter in the signal path of one driver that modifies magnitude in phase while using a second complementary filter in the signal path of another driver that has flat magnitude response but a phase response that matches the phase response of the first filter. Modifying relative phase only can be accomplished by varying relative delay in the signal paths for different drivers, or using filters, with flat magnitude response, but different phase response in each signal path. For example, all pass filters with different cut off frequencies in each signal path may have this property. Varying both relative magnitude and phase can be accomplished by using different filters in each signal path, where the filters can either or both have minimum or nonminimum phase characteristics and arbitrary relative magnitude characteristics.

Figure 3:
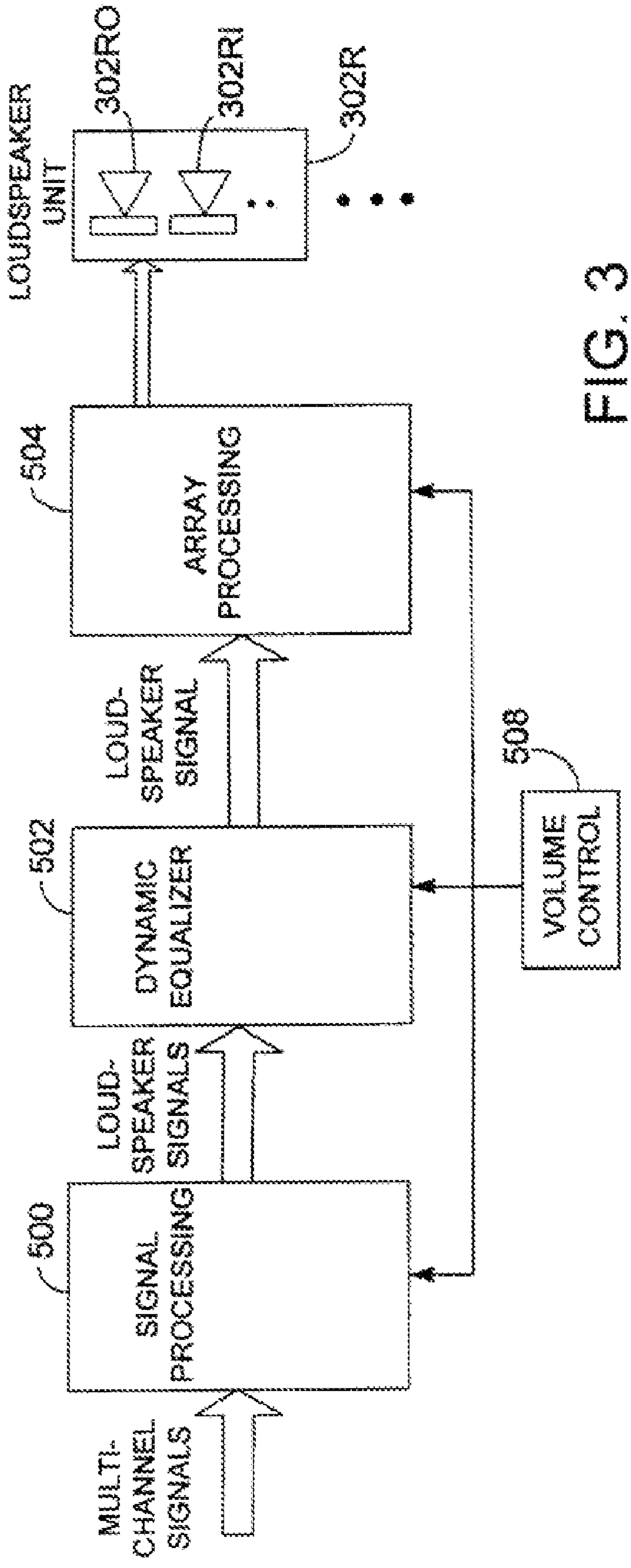
FIG. 3 is a block diagram illustrating the logical arrangement of a subsystem according to the invention.

Referring to FIG. 3, there is shown a block diagram illustrating an embodiment of loudspeaker driver module 306. Multichannel signals energize signal processing module 500 that furnishes loudspeaker signals to dynamic equalizer 502 that furnishes dynamically equalized loudspeaker signals to array processing module 504. Signal processing module 500 typically accepts electrical signals representing multiple audio channels, for example, left, right, center, left surround, right surround, LFE for typical 5.1 channel surround implementation, and may combine some input electrical signals, for example, left and left surround, into aggregate output electrical signals for a loudspeaker driver. Signal processing module 500 may also perform additional signal processing, such as shaping the frequency spectrum of electrical signals such that after processing by dynamic equalizer module 502 and array processing module 504, the transfer function of processing module 500 in combination with appropriate loudspeakers at listener 302 achieves a desired frequency response.

Array processing module 504 furnishes each of the electrical signals that drive the individual drivers, such as 302RI and 302RO inside an enclosure, such as 302R. The electrical signals applied to the drivers have relative phases and magnitudes that determine a directivity pattern of the acoustic signal radiated by the enclosure. Methods for generating individual electrical signals to achieve directivity patterns are more fully described in the aforesaid Pub. No. US 2003/0002693 that has been incorporated by reference. The array processing module 504 furnishes these electrical signals according to a set of desired directivity and acoustic volume characteristics. A user can select a desired acoustic volume level using volume control 508. When the user selects one of the higher volume levels, the array processing module 504 is constructed and arranged to reduce cancellation.

Dynamic equalizer module 502 compensates for changes in the frequency spectrum of a radiated acoustic signal caused by the effects of array processing module 504. Since these effects may be determined based on the volume level, the known desired directivity pattern and the known changes in cancellation desired to occur as a function of volume level, volume control 508 can feed the volume level into dynamic equalizer module 502 (in addition to the signal processing module 500 and the array processing module 504) for establishing the amount of equalization for compensating for the changes to the spectrum of the radiated acoustic signal so as to maintain the radiated relative power response of the system substantially uniform as a function of frequency. Signal processing module 500 performs digital signal processing by sampling the input electrical signals at a sufficient sampling rate such as 44.1 kHz, and produces digital electrical output signals. Alternatively, analog signal processing could be performed on input electrical signals to produce analog electrical output signals.

Dynamic equalizer 502 and array processing module 504 may be embodied with analog circuitry, digital signal circuitry, or a combination of digital and analog signal processing circuitry. The signal processing may be performed using hardware, software, or a combination of hardware and software.

Figure 4:
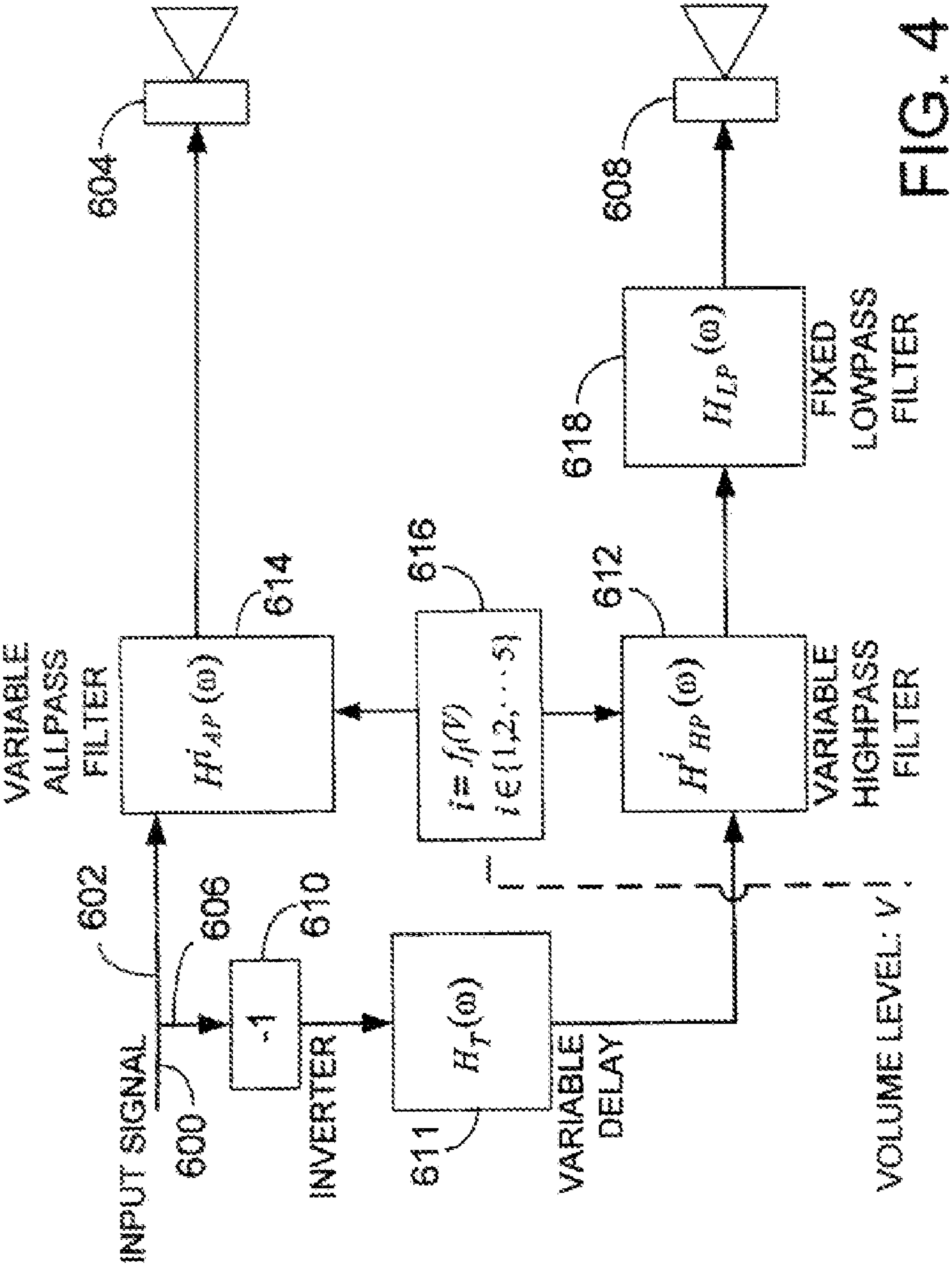
FIG. 4 is a block diagram illustrating the logical arrangement of a signal processing system according to the invention.

Referring to FIG. 4, there is shown a block diagram of an exemplary embodiment of array processing module 504. An input electrical signal 600 is delivered to input 602 of variable all pass filter 614 and to input 606 of inverter 610 that energizes variable delay circuit 611. Inverter 610 provides a 180° relative phase shift at all frequencies with respect to the signal delivered on input 602. Variable delay unit 611 has a response $H\tau(\Omega)=E^{-j\Omega\tau}$ which delays an electrical signal by a variable amount of time $\tau$. This time delay controls the relative phase delay between the two drivers in an enclosure and the resulting directivity pattern. The output of variable delay circuit 611 energizes variable high pass filter 612. This filter functions to progressively exclude lower frequencies first to reduce low frequency cancellation. Reduction of cancellation occurs only above a set threshold volume, which is typically close to the maximum volume setting. Below this volume setting, cancellation is not affected. Above this threshold, the cut off frequency of high pass filter 612 is progressively raised as volume level increases.

Figure 5:
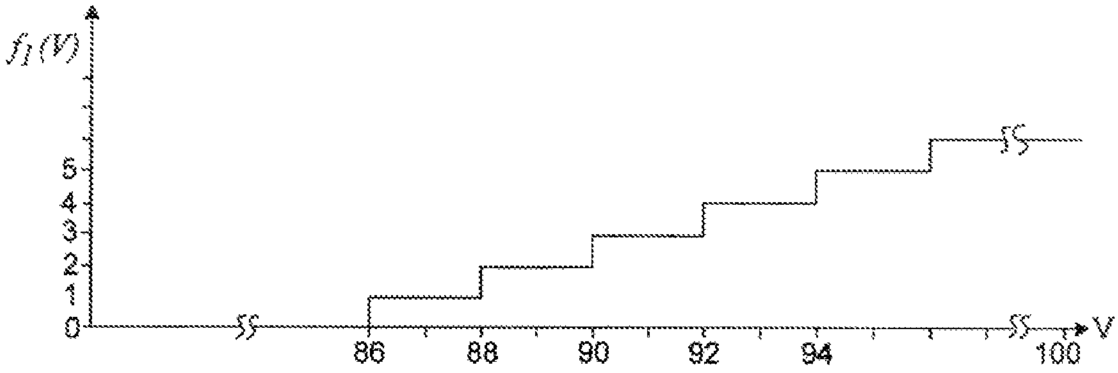
FIG. 5 is a graphical representation of control index as a function of volume level.

In one example, the variable high pass filter 612 begins filtering above a volume level of V=86 (in a system in which V=100 represents maximum system volume, and radiated sound pressure level changes by approximately 0.5 dB per unit step in volume level). A filter index sub-module 616 provides an index signal i as a function of the volume level V according to $i=f_1(V)=u(V-86)+u(V-88)+u(V-90)+u(V-92)+u(V-94)$ for V=1, 2, . . . , 100, where u(V) is a unit step function. The index signal i increases with volume level V, incrementing every two volume levels between 86 and 94, as illustrated in FIG. 5B. For volume levels below V=86 the index signal is i=0 and the cutoff frequency of the highpass filter is low enough so that the highpass filter has minimal if any effect on the signal (e.g., cutoff frequency at or below 210 Hz). The highpass filter frequency response is determined by the following equation:

$$H^i_{HP}(\omega)=\frac{-\omega^2}{\omega_i^2-\omega^2+\frac{j\omega_i\omega}{Q}}\text{ for } i\geq 1,$$

where $$Q=\frac{1}{\sqrt{2}},$$

$\omega_i$ is the angular cutoff frequency (in radians/second) which increases with increasing index signal i according $\omega_0/2\pi=210$, $\omega_1/2\pi=219$, $\omega_2/2\pi=269$, $\omega_3/2\pi=331$, $\omega_4/2\pi=407$, $\omega_5/2\pi=501$, and $j=\sqrt{-1}$. The initial cutoff frequency $f_0=210$ Hz ($f_0=\omega_0/2\pi$) has minimal influence on the directivity of the array which operates in a mid range of frequencies of approximately 210 Hz to 3 kHz. The highest cutoff frequency $f_5=501$ Hz is chosen according to an acceptable directivity and sound level (e.g., by listening tests). This implementation of the array processing module 504 preserves directivity of the array for frequencies above 501 Hz at all volume levels. The directivity of the array for frequencies between 210 and 501 Hz is systematically altered at volume levels of 86 and above, that allows the loudspeaker system to play louder.

Figure 6:
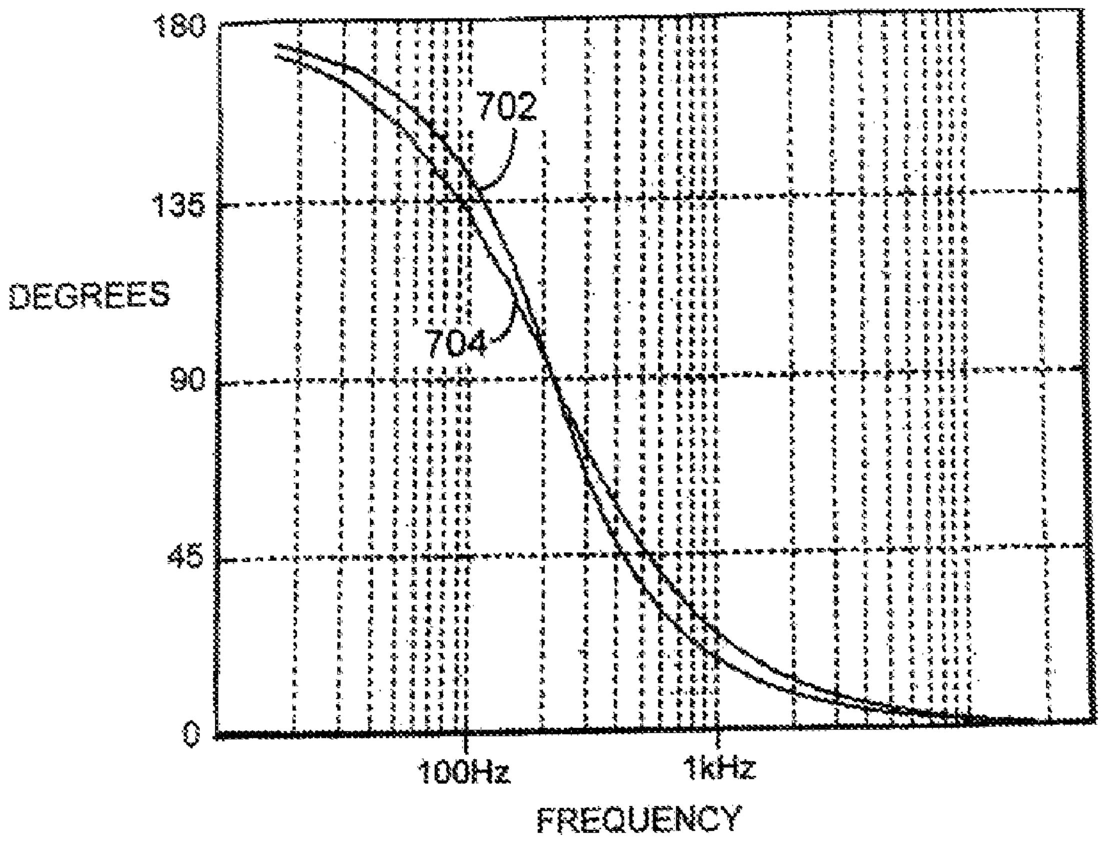
FIG. 6 is a graphical representation of phase as a function of frequency for high pass and all pass filters.

Since the phase response of the high-pass filter 612 can potentially significantly modify the phase relationship between the two paths, the first path 602 includes a variable allpass filter 614 with a phase response that approximately matches that of the highpass filter, to at least partially compensate for any phase effects. A substantially exact match is possible where the high-pass filter is critically damped, and the all-pass filter is a first order all-pass filter with the same cutoff frequency as the high pass filter. The variable all-pass filter 614 has a frequency response $H_{AP}^0(\omega)=1$ for volume levels below V=86, and a frequency response $$H^i_{AP}(\omega)=\frac{j\omega-\omega_i}{j\omega+\omega_i}$$

for volume levels at or above V=86. The filter index sub-module 616 also supplies the index signal i to the variable all-pass filter 614 such that its phase approximately tracks the phase of the variable high-pass filter 612, which is accomplished by having the cutoff frequencies of the high pass and all pass filters track with changes in the index signal. The phases of $H_{HP}^i(\omega)$ and $H_{AP}^i(\omega)$ for a cutoff frequency $f_1$ of 219 Hz ($f_1=\omega_1/2\pi$) are shown in FIG. 6. The plots show that the phase 702 of the second order high-pass filter 612 is appropriately matched by the phase 704 of the first order all-pass filter 614.

In some implementations a fixed low-pass filter 618 is included in the second path 606 to limit high-frequency output of one driver 608, pointed to the inside in order to direct most of the high frequency acoustic energy from the outside driver 604 pointed to the outside. The low-pass filter reduces output from the canceling driver at higher frequencies, so that high frequency information is only radiated by the outside drivers. In one implementation, the frequency response of the low-pass filter 618 is $$H_{LP}(\omega) = \frac{\omega_L^2}{\omega_L^2 - \omega^2 + \frac{j\omega_L\omega}{Q}}, \text{ where } Q = \frac{1}{\sqrt{2}},$$

and $\omega_L$=3 kHz is the cutoff frequency.

It may be advantageous to use smooth updating incident impulse response (IIR) digital filters for switching between successive indices. A blending sequence smoothly ramps successive filters in (and out) of the signal path while clearing the state of the filter during the transition free of artifacts.

Figure 7:
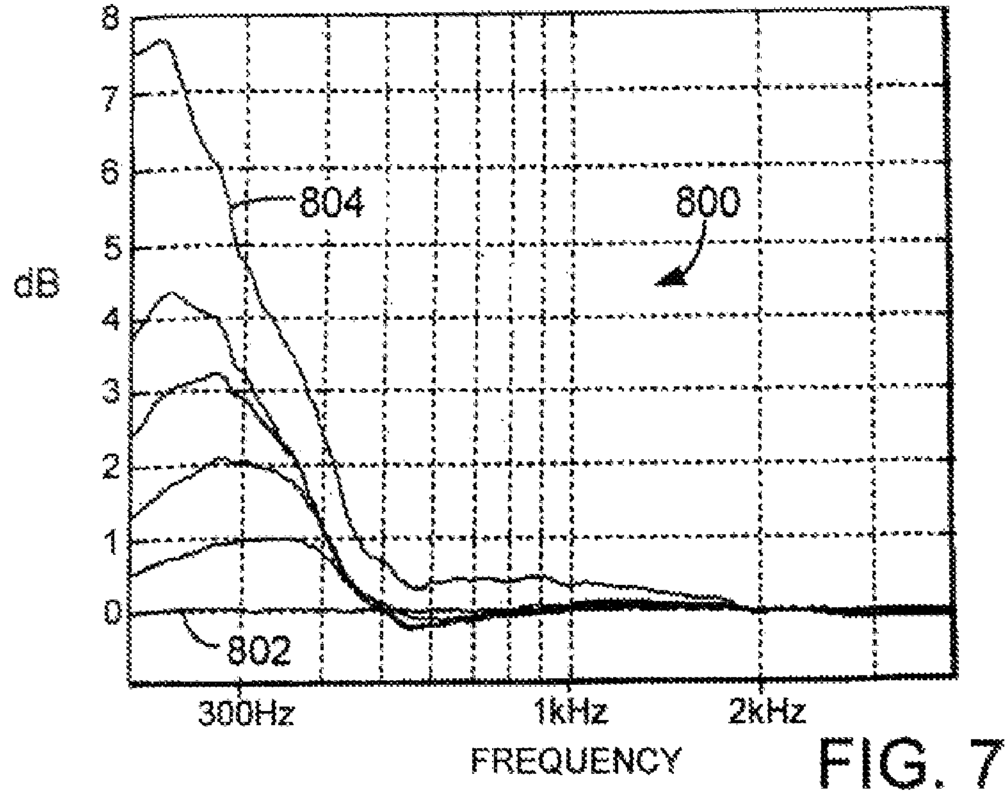
FIG. 7 is a graphical representation of radiated power as a function of frequency at different power levels.

Referring to FIG. 7, a family of six curves 800 represent an example of changes in radiated acoustic power spectrum produced by the array processing module 504 as compensated by dynamic equalizer module 502. The family of curves 800 are log plots of a radiated acoustic power spectrum $S_2(\omega)$ of a two-element speaker array relative to the radiated acoustic power spectrum $S_1(\omega)$ of a single speaker element (corresponding to the second speaker element being completely off):

$$-10\log\left(\frac{S_2(\omega)}{S_1(\omega)}\right).$$

A nearly flat curve 802 represents residual effects of a highly filtered ($f_5$=501 Hz) second array element. The shape of successive curves changes nearly continuously from that of curve 804 representing the initial filtering ($f_0$=210 Hz). For the initial filtering case, curve 804, the radiated power at low frequencies for the two-element array is much smaller than the radiated power of a single element (i.e., $S_2(\omega)<S_1(\omega)$), due to destructive interference. Curve 804 at low frequencies shows that the quantity $$Y = -10\log\left(\frac{S_2(\omega)}{S_1(\omega)}\right)$$

has a large positive value, which implies $S_2(\omega)<S_1(\omega)$. Such curves can be generated by experimental measurements (e.g., taken in an anechoic environment or in a room), by theoretical modeling, by simulation, or by a combination of such methods.

Figure 9:
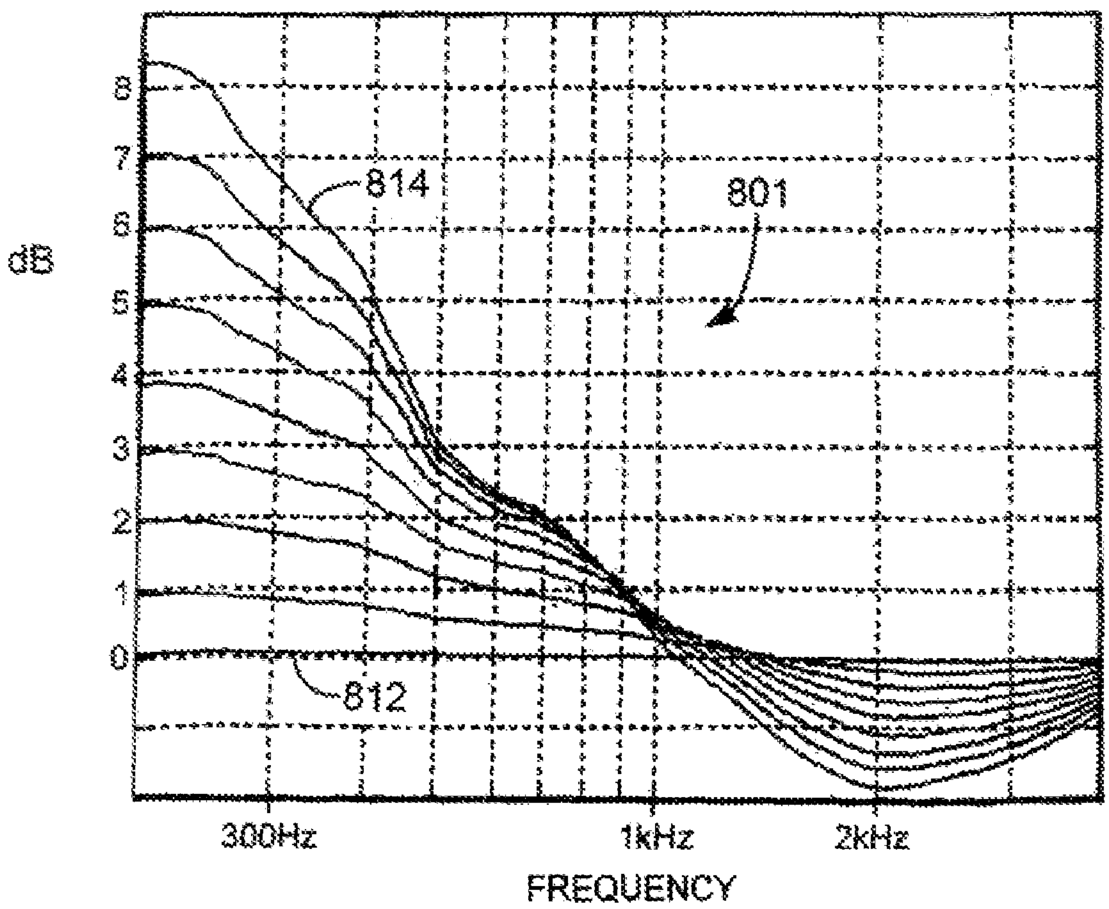
FIG. 9 is a graphical representation of radiated power as a function of frequency at different power levels for another embodiment.

Referring to FIG. 9, a family of nine curves 810 represents an example of changes in a radiated acoustic power spectrum produced by another implementation of the array processing module. In this implementation, the array processing module simply attenuates the amplitude radiated by the inside driver (the canceling driver) of a two-driver array over successive volume levels to increase sound level. The amplitude radiated by the inside driver is attenuated from an initial value of −4 dB relative to the outside driver to a value of −40 dB (for maximum sound output), over nine volume levels from V=86 to V=94. A nearly flat curve 812 represents residual effects of a highly attenuated (−40 dB) radiation from the inside driver. The shape of successive curves changes nearly continuously from that of curve 814 representing the initial attenuation (−4 dB). For the initial attenuation case, curve 814, the radiated power at low frequencies for the two-driver array is much smaller than the radiated power of a single driver (i.e., $S_2(\omega)<S_1(\omega)$), due to destructive interference.

Figure 12:
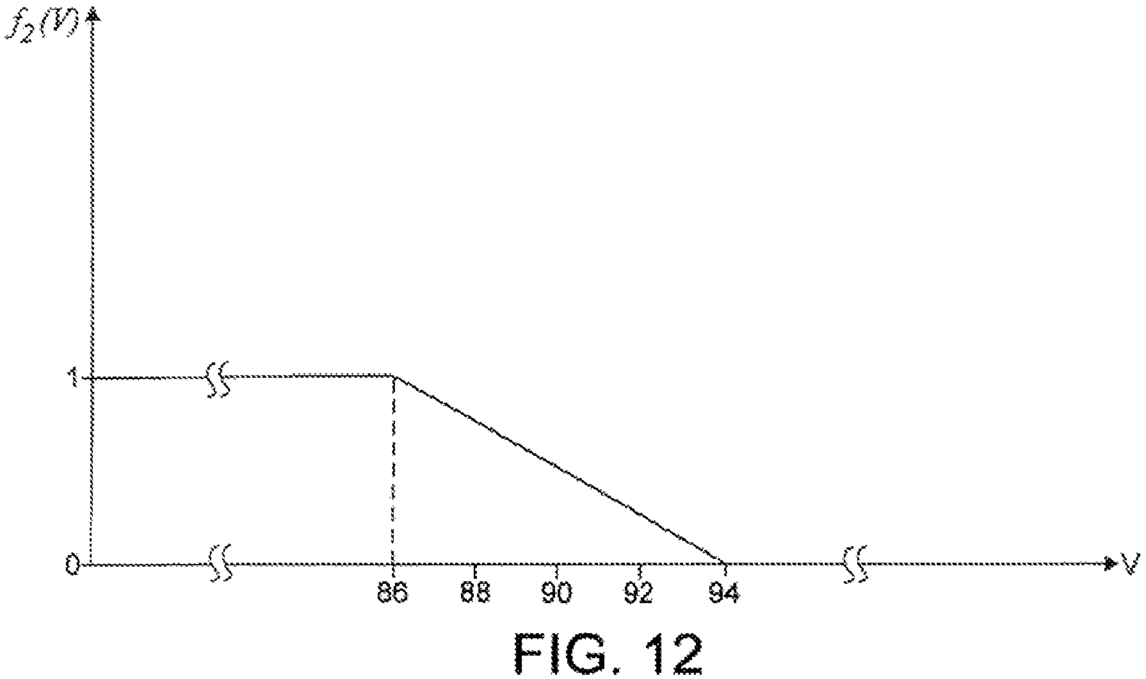
FIG. 12 is a graphical representation of filter coefficient as a function of volume level.
Figure 11:
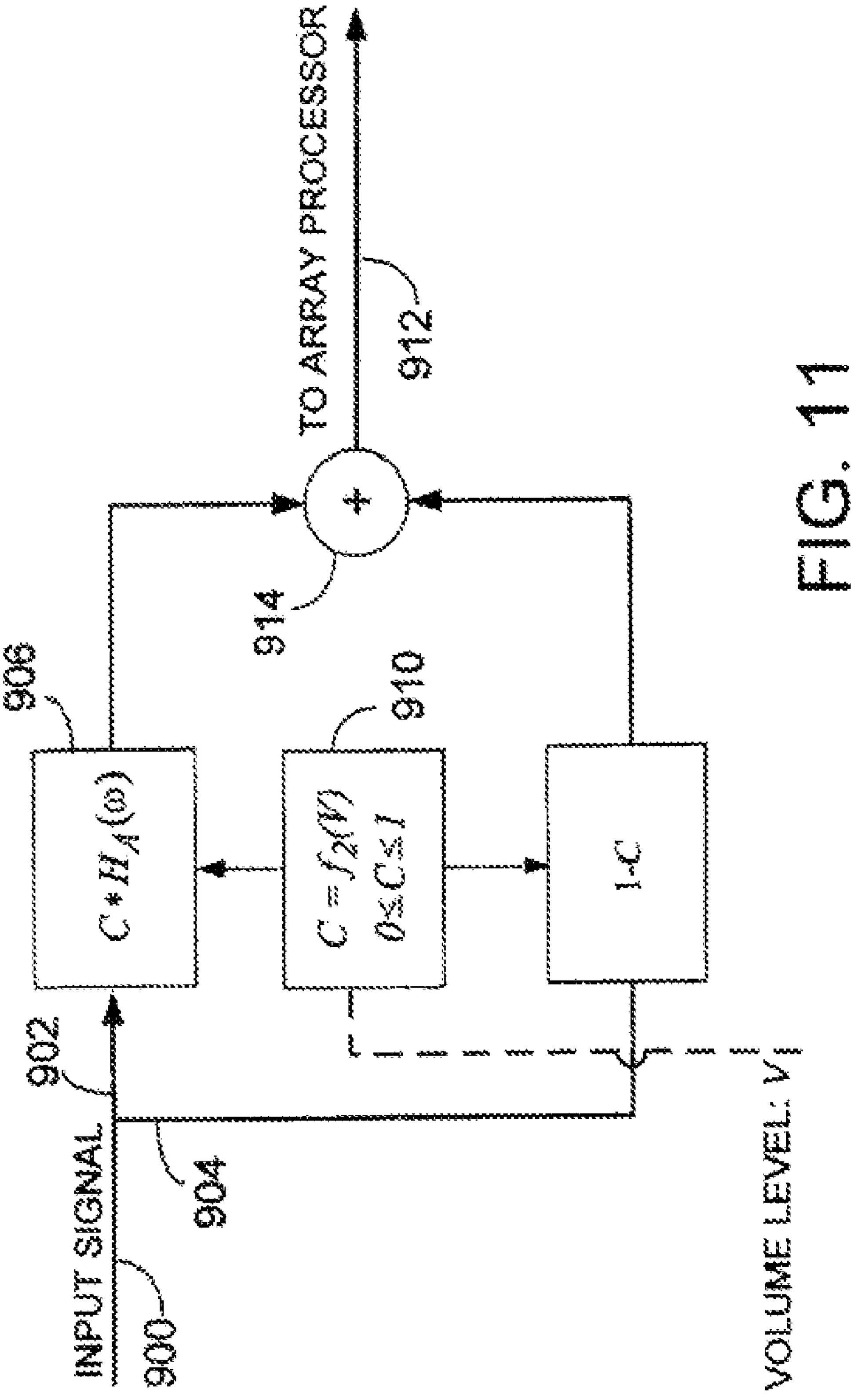
FIG. 11 is a block diagram illustrating the logical arrangement of an equalization module.

FIG. 11 shows a block diagram of an implementation of the dynamic equalizer module 502 whose parameters are chosen to compensate for change in the radiated acoustic power spectrum as the array directivity changes. The input electrical signal 900 comes from the signal processing module 500, and the output electrical signal 912 goes to the array processing module 504. The input electrical signal is split into a first signal on path 902 and a second signal on path 904. A filter coefficient sub-module 910 provides a coefficient signal C as a function of volume level V according to $$C = f_2(V) = 1 - \frac{(V-86)}{8}[u(V-86) - u(V-94)] - u(V-94),$$

as illustrated in FIG. 12. The coefficient signal C is applied to submodule 90 band submodule 908 to determine a proportion of a first filtered path 902, and a second unfiltered path 904, that combine in adder 914 to produce the output electrical signal 912. The resulting output signal 912 is an equalized version of the input signal 900 according to the transfer function: $H_{EQ}(\omega)=1+C(H_A(\omega)-1)$, where $H_A(\omega)$ is the frequency response of a filter that compensates for the effects of the second array driver.

Figure 8:
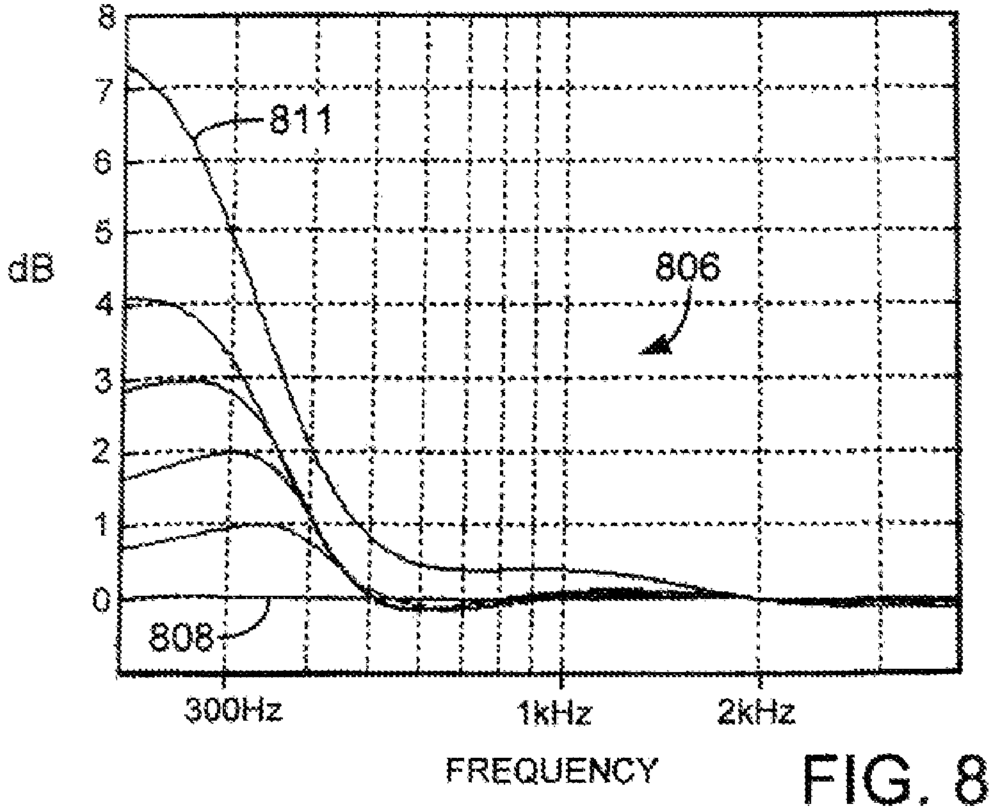
FIG. 8 is a graphical representation of equalized responses as a function of frequency at different levels.

For volume levels at or below V=86, the coefficient signal C has the value 1 and the output signal 912 is equalized according to a frequency response of array filter sub-module 906

$$H_A(\omega) = \frac{(j\omega - z_1^+)(j\omega - z_1^-)(j\omega - z_2^+)(j\omega - z_2^-)}{(j\omega - p_1^+)(j\omega - p_1^-)(j\omega - p_2^+)(j\omega - p_2^-)},$$

where the four poles $p_1^{\pm}$, $p_2^{\pm}$ and four zeros $z_1^{\pm}$, $z_2^{\pm}$ have the form $$-\frac{\omega_0}{2Q} \pm j\sqrt{\omega_0^2 - \left(\frac{\omega_0}{2Q}\right)^2}$$

and values corresponding to those shown in Tables 1 or 2. Table 1 corresponds to values used for the highpass filtered canceler implementation of FIG. 7. Table 2 corresponds to values used for the attenuated canceler implementation of FIG. 8.

For volume levels at or above V=94, the coefficient signal C has the value 0 and the output signal 912 is the same as the input signal 900, being equalized without the effects of the second array driver. For volume levels between 86 and 94, the output of the second array driver is gradually reduced starting from a volume setting of 84 while preserving the spectrum using the dynamic equalizer module 502, allowing the array to achieve significantly increased radiation at volume settings of 94 and above. The dynamic equalizer module 502 filters the output signal appropriately to compensate for the changing effects of the second array driver (through filtering or attenuation).

TABLE 1

| Pole/Zero: | $\omega_0$ (Hz) | Q |
|---|---|---|
| $p_1^{\pm}$ | 1600 | 0.73 |
| $p_2^{\pm}$ | 2750 | 0.92 |
| $z_1^{\pm}$ | 1680 | 0.74 |
| $z_2^{\pm}$ | 3990 | 0.95 |

TABLE 2

| Pole/Zero: | $\omega_0$ (Hz) | Q |
|---|---|---|
| $p_1^{\pm}$ | 727 | 1.16 |
| $p_2^{\pm}$ | 266 | 0.83 |
| $z_1^{\pm}$ | 684 | 1.14 |
| $z_2^{\pm}$ | 441 | 0.72 |

The spectral responses $|H_{EQ}(\omega)|^2$ for each of the six volume levels corresponding to the high-pass filtered canceler implementation of FIG. 11 are shown in FIG. 9. The flat curve 808 represents the equalization used for the relative spectrum corresponding to curve 802, and the curve 811 represents the equalization used for the relative spectrum corresponding to curve 804. The match between the family of curves 800 representing the effects of the array processing and the family of curves 806 representing the equalization is preferably close enough to provide a substantially uniform radiated acoustic power spectrum.

Figure 10:
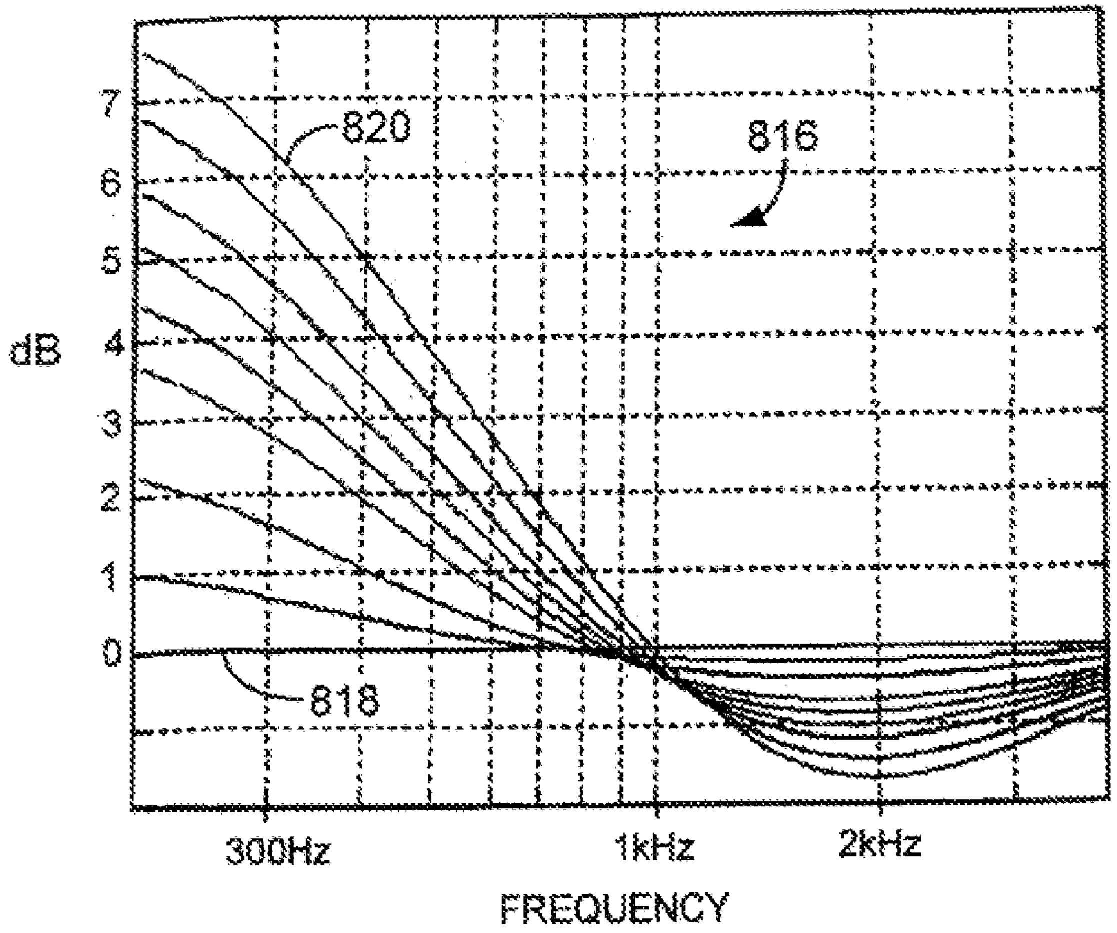
FIG. 10 is a graphical representation of equalization responses as a function of frequency at different levels.

The spectral responses $|H_{EQ}(\omega)|^2$ for each of the nine volume levels of the attenuated canceler implementation of FIG. 11 are shown in FIG. 10. The flat curve 818 represents the equalization used for the relative spectrum corresponding to curve 812, and the curve 820 represents the equalization used for the relative spectrum corresponding to curve 814. The match between the family of curves 810 representing the effects of the array processing and the family of curves 816 representing the equalization is preferably close enough to provide a consistent acoustic power spectrum as perceived by a listener.

Figure 13:
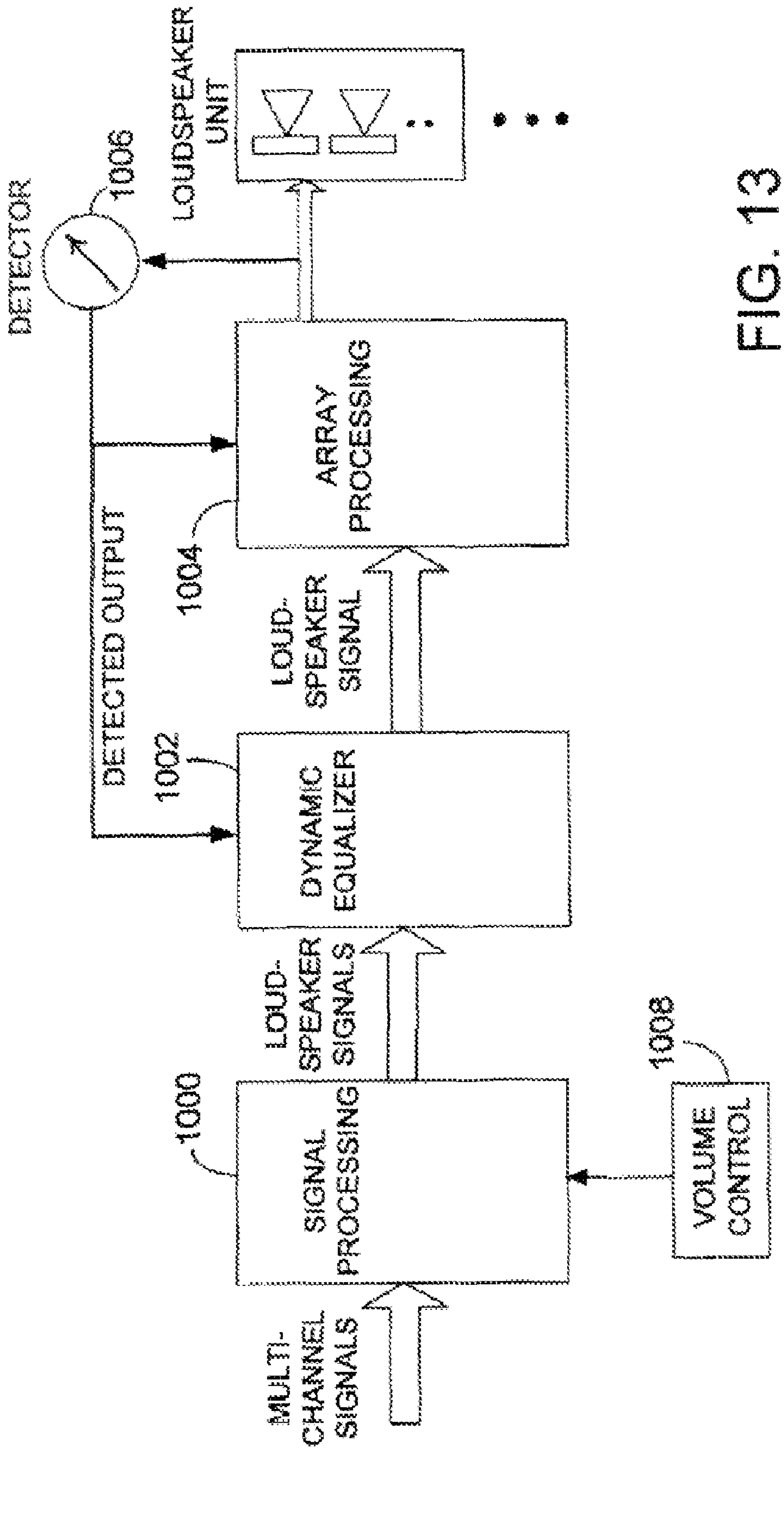
FIG. 13 is a block diagram illustrating the logical arrangement of a system according to the invention.

Referring to FIG. 13 an alternate implementation of the loudspeaker driver module 306 includes a signal processing module 1000, a dynamic equalizer module 1002, and an array processing module 1004, with a detector 1006 used to provide a control signal for the dynamic equalizer module 1002 and the array processing module 1004. In this implementation the volume control 1008 determines the amplitude of electrical signals in the signal processing module 1000, and the detector 1006 determines level of one or more of the output electrical signals to provide an indication of the radiated power level. In this implementation, array directivity and compensating equalization are all changed as a function of the detected signal level. Control of directivity and acoustic volume characteristics as described above can be implemented using this detected control signal, the volume control, or any other parameter associated with operation of the array.

It is evident that those skilled in the art may now make numerous uses and modifications of and departures from the specific apparatus and techniques disclosed herein. For example, the array processing and the dynamic equalization can be performed within a single module. Each array of drivers in the loudspeaker system may have a separate loudspeaker driver module. Control of cancellation and acoustic volume characteristics and the associated compensating equalization can be performed for electrical signal components (e.g., based on a first audio channel) which are combined with other electrical signal components (e.g., based on a second audio channel) to drive drivers of an array. Consequently, the invention is to be construed as embracing each and every novel feature and novel combination of features present in or possessed by the apparatus and techniques herein disclosed and limited solely by the spirit and scope of the appended claims.

What is claimed is:

1. A method comprising:

controlling at least two different audio electrical signals to be provided respectively to at least two electroacoustical transducers of an array to selectively reduce cancellation of acoustic signals produced by the transducers at frequencies below $F_D$=c/2D, in which D is an inter-transducer distance and c is the speed of sound, the controlling being done as a function of at least one of a volume control and a detected signal level, the reduction in cancellation changing a radiated acoustic power spectrum of the array at frequencies below $F_D$, and equalizing the audio electrical signals below $F_D$ based on the change in the radiated acoustic power spectrum.

2. The method of claim 1 in which the equalizing of the audio electrical signals comprises maintaining the radiated acoustic power spectrum substantially uniform.

3. The method of claim 1 in which the equalizing occurs prior to the controlling.

4. The method of claim 1 in which the change in the acoustic power spectrum resulting from the controlling of the signals is predicted, and the equalizing is based on the change predicted.

5. The method of claim 1 in which the equalizing is based on a-volume level selected by a user.

6. The method of claim 1 in which the equalizing is based on a signal level detected in the controlled audio electrical signals.

7. The method of claim 1 in which the controlling comprises reducing the amplitude of one of the audio electrical signals for higher acoustic volume levels.

8. The method of claim 7 in which the controlling comprises combining two components of an intermediate electrical signal in selectable proportions.

9. The method of claim 1 in which the controlling of the audio electrical signals comprises adjusting a level of one of the signals over a limited frequency range.

10. Electroacoustical transducing apparatus comprising:

an input terminal to receive an input audio electrical signal, a plurality of at least two electroacoustical transducers in an array, and circuitry constructed and arranged to generate and control at least two different but related output audio electrical signals from the input audio electrical signal, wherein the at least two different but related output signals are coupled respectively to said at least two electroacoustical transducers of an array and to selectively reduce cancellation of acoustic signals produced by the transducers at frequencies below $F_D$=c/2D, in which D is an inter-transducer distance and c is the speed of sound, the controlling being done as a function of at least one of a volume control and a detected signal level, the reduction in cancellation changing a radiated acoustic power spectrum of the array at frequencies below $F_D$ and to equalize the output signals below $F_D$ based on the change in the radiated acoustic power spectrum.

11. The apparatus of claim 10 in which the circuitry comprises a dynamic equalizer.

12. The apparatus of claim 11 in which the dynamic equalizer includes a pair of signal processing paths and a combiner to combine signals that are processed in the pair of signal processing paths.

13. The apparatus of claim 11 in which the circuitry is also constructed and arranged to compensate for the change based on a volume level.

14. An electroacoustical transducer array comprising:

a source of related electrical signal components, a plurality of at least two electroacoustical transducers driven by respective ones of said related electrical signal components, an input terminal to receive input audio electrical signals, and circuitry constructed and arranged to generate at least two different but related output audio electrical signals coupled respectively to said at least two electroacoustical transducers of an array and to control the at least two different but related output signals to selectively reduce cancellation of acoustical signals produced by the transducers at frequencies below $F_D$=c/2D, in which D is an inter-transducer distance and c is the speed of sound, the controlling being done as a function of at least one of a volume control and a detected signal level, the reduction in cancellation changing a radiated acoustic power spectrum of the array at frequencies below $F_D$, and to equalize the output audio electrical signals below $F_D$ based on the change in the radiated acoustic power spectrum.

15. The apparatus of claim 14 in which the circuitry comprises a dynamic equalizer.

16. The apparatus of claim 15 in which the dynamic equalizer includes a pair of signal processing paths and a combiner to combine signals that are processed in the pair of signal processing paths.

17. The apparatus of claim 14 also comprising a second input terminal to carry a signal indicating a volume level for use by the circuitry.

18. A sound system comprising:

a source of related electrical signal components, a pair of electroacoustical transducer arrays, each of the arrays comprising a plurality of electroacoustical transducers driven respectively by said related electrical signal components, an input terminal to receive input audio electrical signals, and circuitry constructed and arranged to generate two different but related output audio electrical signals coupled to respective ones of said electroacoustical transducers of respective arrays and to control the two different but related output signals to selectively reduce cancellation of acoustic signals produced by the transducers at frequencies below $F_D$=c/2D, in which D is an inter-transducer distance and c is the speed of sound, the controlling being done as a function of at least one of a volume control and a detected signal level, the reduction in cancellation changing a radiated acoustic power spectrum of the array at frequencies below $F_D$ and to equalize the audio electrical signals below $F_D$ based on the change in the radiated acoustic power spectrum.

19. The electroacoustical transducing apparatus in accordance with claim 10 wherein said array comprises first and second closely spaced loudspeaker drivers having their axes angularly displaced by substantially 60 degrees.

* * * * *